(12) United States Patent
Chen

(10) Patent No.: US 12,219,310 B2
(45) Date of Patent: Feb. 4, 2025

(54) MULTIFUNCTIONAL RADIO

(71) Applicant: Lizhen Chen, Guangdong (CN)

(72) Inventor: Lizhen Chen, Guangdong (CN)

( * ) Notice: Subject to any disclaimer, the term of this patent is extended or adjusted under 35 U.S.C. 154(b) by 182 days.

(21) Appl. No.: 18/157,020

(22) Filed: Jan. 19, 2023

(65) Prior Publication Data

US 2023/0388688 A1    Nov. 30, 2023

(30) Foreign Application Priority Data

May 27, 2022   (CN) .......................... 202221953189.2

(51) Int. Cl.
| | |
|---|---|
| *H04R 1/02* | (2006.01) |
| *F21V 33/00* | (2006.01) |
| *G08B 3/10* | (2006.01) |
| *H01Q 1/12* | (2006.01) |
| *H02J 7/00* | (2006.01) |
| *H05K 5/00* | (2006.01) |

(52) U.S. Cl.
CPC ........... *H04R 1/028* (2013.01); *F21V 33/008* (2013.01); *G08B 3/1008* (2013.01); *H01Q 1/12* (2013.01); *H02J 7/0042* (2013.01); *H05K 5/0004* (2013.01)

(58) Field of Classification Search
CPC ........ H04R 1/028; F21V 33/008; H01Q 1/12; H05K 5/0004
USPC .................................. 381/334, 87, 332, 335
See application file for complete search history.

(56) References Cited

U.S. PATENT DOCUMENTS

| | | |
|---|---|---|
| 5,453,912 A | 9/1995 | Lytle et al. |
| 2021/0002170 A1* | 1/2021 | Chien ..................... H05B 45/30 |
| 2021/0099244 A1 | 4/2021 | Zeng |

FOREIGN PATENT DOCUMENTS

| | | |
|---|---|---|
| CN | 215807973 U | 2/2022 |
| CN | 216388306 U | 4/2022 |

* cited by examiner

*Primary Examiner* — Thjuan K Addy

(57) ABSTRACT

Provided is a multifunctional radio. A waveband lens, a volume knob, a frequency modulation knob, a switching key and an SOS key are arranged on an outer panel surface of a front shell. A hand rocker, a reading lamp and an antenna are arranged on a rear shell. A first placing groove and a second placing groove are respectively formed at the top and the bottom of the rear shell. A first power output module is arranged in the first placing groove. A second power output and input module is arranged in the second placing groove. A lighting lamp module, a lighting switch key and a reading lamp module are arranged on a radio shell.

8 Claims, 6 Drawing Sheets

MULTIFUNCTIONAL RADIO

TECHNICAL FIELD

The utility model relates to the field of radios, and in particular to a multifunctional radio.

BACKGROUND

Radios are widely applied in outdoor or emergency situations. For example, in an earthquake, many infrastructures in the earthquake area may be damaged, resulting in power failure and no network, so signals from the outside cannot be received, but the radios can receive messages without relying on the network. However, the simple receiving function cannot meet the needs of modern people any more. Some radios have been used as outdoor travel devices. Existing radios have less functions and low universality, and are inconvenient to use.

SUMMARY

An objective of the utility model is to provide a multifunctional radio, thereby integrating a radio function, a lighting function, a reading lamp function and an SOS alarm function. A hand-cranked power generation apparatus is provided and can perform hand-cranked power generation outdoors and in other situations where charging cannot be performed. A power output module is provided, supports four types of data lines, can be matched with different electronic devices for charging, and has higher applicability.

To achieve the above objective, the utility model provides the following technical solutions:

a multifunctional radio includes a radio shell, wherein the radio shell includes a front shell and a rear shell; the front shell and the rear shell are butted to form a cuboid shell; several sound outlet hole are arranged on one side panel surface of an outer panel surface of the front shell, and a waveband lens, a volume knob, a frequency modulation knob, a switching key and an SOS key are arranged on the other side panel surface of the outer panel surface of the front shell; a hand rocker and a reading lamp antenna are arranged on an outer panel surface of the rear shell; a first placing groove is formed at the top of the rear shell, and a first power output module is arranged in the first placing groove; a second placing groove is formed at the bottom of the rear shell, and a second power output and input module is arranged in the second placing groove; a lighting lamp module is arranged on a side panel surface of one side of the radio shell, and a lighting switch key is arranged at the top of the radio shell; and a reading lamp module is arranged on one side panel surface of the radio shell.

Further, the radio shell is further internally provided with:

a main control panel, fixedly mounted on an insulated isolation column of the rear shell; a loudspeaker, arranged at the position of the sound outlet hole on an inner panel surface of the front shell and fixedly connected to the inner panel surface of the front shell, the loudspeaker being electrically connected to the main control panel; a first battery, the first battery being fixedly connected to an inner side panel surface of the rear shell, and the first battery being electrically connected to the main control panel; a second battery, fixedly connected to the inner side panel surface of the rear shell, the second battery being electrically connected to the main control panel; and a power output control panel, fixedly connected to an inner surface of a side of the rear shell, the power output control panel being electrically connected to the main control panel, and the power output control panel being electrically connected to the first power output module and the second power output and input module, respectively.

Further, the main control panel is respectively provided with a waveband lens, a volume adjusting module, a frequency channel adjusting module, a frequency modulation toggling block and an SOS alarm module at the positions corresponding to the waveband lens, the volume knob, the frequency modulation knob, the switching key and the SOS key on the outer side panel surface of the outer panel surface of the front shell; and the volume knob and the volume adjusting module are fixedly mounted, the frequency modulation knob and the frequency channel adjusting module are fixedly mounted, and the SOS key is mounted on the SOS alarm module.

Further, the main control panel is further provided with a USB charging interface, the outer panel surface of the front shell is provided with a through hole at the position corresponding to the USB charging interface, a detachable waterproof cover is arranged on an outer surface of the through hole, and the waterproof cover prevents the charging interface from getting wet with water.

Further, an electric generator is fixedly mounted on the rear shell, and the electric generator is electrically connected to the main control panel.

Further, a hand rocker is hinged at the position, corresponding to the electric generator, of the outer side of the rear shell; one end of the hand rocker is in clamping connection with the electric generator; and the hand rocker is shaken to drive the electric generator to generate electricity.

Further, an antenna is arranged on the rear shell; one end of the antenna is hinged with the rear shell; and the antenna is electrically connected to the main control panel.

Further, the lighting lamp module is fixedly mounted on a left side of the radio shell; a lighting control panel is fixedly mounted on an inner side of the rear shell; the lighting lamp module is electrically connected to the lighting control panel; the lighting switch key is arranged on an upper surface of the rear shell; and the lighting switch key is electrically connected to the lighting control panel and configured to control the lighting lamp module.

According to the analysis, the utility model discloses a multifunctional radio, which is provided with a lighting lamp module, a radio module, a power output module, an SOS alarm module and a reading lamp module, integrates various functions and is more convenient to use. The power output module has four interface types of data lines, is convenient to adapt to numerous electronic device interfaces, and has higher applicability. A hand-cranked charging module is provided and can perform hand-cranked charging outdoors and in other situations where charging cannot be performed, thereby improving the cruising ability of products.

BRIEF DESCRIPTION OF THE DRAWINGS

The drawings of the description constituting a part of the present application are used to provide a further understanding of the utility model. The exemplary embodiments of the utility model and descriptions thereof are used to explain the utility model and do not constitute an improper limitation to the utility model. In the drawings.

Figure 1:
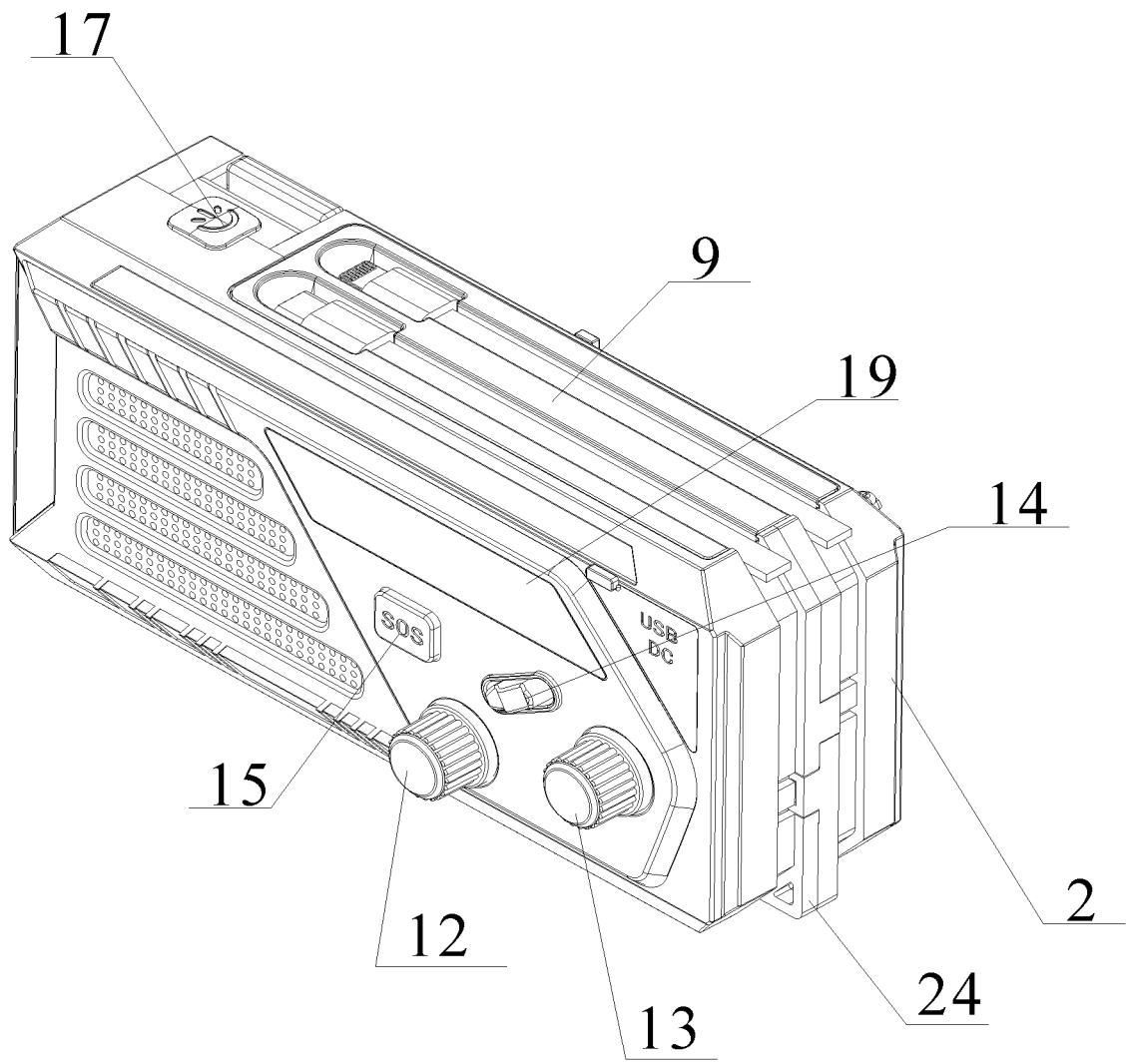
FIG. 1 is a schematic diagram of an three-dimensional structure showing front, upper and right surfaces according to an embodiment of the utility model.

Description of reference numerals: 1—front shell; 2—rear shell; 3—main control panel; 4—first battery; 5—electric generator; 6—second battery; 7—loudspeaker; 8—lighting lamp module; 9—first power output module; 10—second power output and input module; 11—power output control panel; 12—volume knob; 13—frequency modulation knob; 14—switching key; 15—SOS key; 16—waterproof cover; 17—lighting switch key; 18—lighting control panel; 19—waveband lens; 21—hand rocker; 22—reading lamp module; 23—antenna; 24—lifting rope position; 30—volume adjusting module; 31—frequency channel adjusting module; 32—frequency modulation toggling block; 33—USB charging interface; 34—electric quantity indicator lamp; 35—waveband lens; 36—SOS alarm module; 91—first fixed shell; 92—first data line set; 101—second fixed shell; 102—second data line set; 201—first placing groove; 202—second placing groove.

DETAILED DESCRIPTION OF THE EMBODIMENTS

The utility model will be described in detail below with reference to the accompanying drawings and the embodiments. Each example is provided to explain the utility model instead of limiting the utility model. In fact, those skilled in the art will appreciate that modifications and variations may be made in the utility model without departing from the scope or spirit of the utility model. For example, features shown or described as one part of one embodiment may be applied to another embodiment to generate yet another embodiment. Therefore, it is expected that the utility model includes such modifications and variations that fall within the scope of the appended claims and their equivalents. The specification and accompanying drawings are used to enable those skilled in the art to manufacture and use the utility model, and are not intended to limit the scope of the utility model. In terms of the disclosed method, the presented steps are essentially exemplary; therefore, unless otherwise disclosed, the order of the steps is not necessary or critical.

The following description of technology is merely exemplary in nature of subjects, manufacturing and use of one or more utility models, and is not intended to limit the scope, application or use of any specific utility model claimed in the present application or other applications that may be submitted to claim the priority of the present application, or the patents issued therefrom. With regard to the disclosed method, the order of the presented steps is essentially exemplary; therefore, in various embodiments, the order of the steps may be different, including the case where some steps may be performed at the same time, unless otherwise explicitly stated. As used herein, "a" and "an" indicate the presence of "at least one" term; and where possible, a plurality of such terms may be present. Unless other explicitly stated, when the widest scope of the technology, all numeral values in the specification should be understood as modified by the word "about", and all geometric and spatial descriptors should be understood as modified by the word "substantially". When applied to the numerical values, "about" indicates that calculation or measurement allows the numerical values to have some slight inaccuracy (some of numerical values are close to accuracy; approximately or reasonably close to the numerical value; almost). If, for some reason, the inaccuracy caused by "about" and/or "substantially" cannot be understood in this common sense in the art, "about" and "substantially" as used herein at least indicate the possible changes of the common methods of measuring or using these parameters.

Unless otherwise specified, all documents cited in the specific embodiments, including patents, patent application and scientific documents, are incorporated herein by reference. In case of any conflict or ambiguity between the documents incorporated by reference and this specific embodiment, this specific embodiment shall prevail.

Although the open term "including", which is a synonym of non-restrictive term such as including, containing or having, is used to describe and claim the embodiments protecting the technology, but the embodiments may optionally be described by more restrictive terms such as "composed of" or "basically composed of". Therefore, for any given embodiment listing materials, components or process steps, the technology further specifically includes embodiments composed of the materials, components or process steps or basically composed of the materials, components or process steps, does not include another materials, components or processes (composed of), and does not include another materials, components or processes (basically composed of) affecting the significance of the embodiment, even the another materials, components or processes are not explicitly listed in the present application.

When an element or layer is referred to as "on another element or layer", "joined to another element or layer", "connected to another element or layer" or "coupled to another element or layer", the element or layer may be directly on another element or layer, joined to another element or layer, connected to another element or layer or coupled to another element or layer, or an intermediate element or layer may be present. On the contrary, when an element is referred to as "directly on another element or layer", "directly joined to another element or layer", "directly connected to another element or layer" or "directly coupled to another element or layer", an intermediate element or layer may not be present. Other words for describing the relation between elements should be interpreted in a similar way (for example, "between" and "directly between", and "adjacent" and "directly adjacent"). As used herein, the term "and/or" includes any combination and all combinations of one or more of the associated listed items.

Although terms such as first, second and third may be used here to describe various elements, parts, areas, layers and/or portions, these elements, parts, areas, layers and/or portions should not be limited by these terms. These terms are only used to distinguish one element, part, area, layer or portion from another area, layer or portion. Unless the context clearly indicates, terms such as "first" and "second" and other numerical terms used herein do not indicate order or sequence. Therefore, without departing from the instruction of the exemplary embodiments, a first element, part, area, layer or portion discussed below may be referred to as a second element, part, area, layer or portion. The accompanying drawings show one or a plurality of examples of the utility model. The detailed description uses reference numerals and letters to refer to the features in the accompanying drawings. Similar numeral references in the drawings and description have been used to refer to the similar parts in the utility model. As used herein, the terms "first", "second" and "third" are used interchangeably to distinguish one component from another component, and are not intended to indicate the position or importance of individual components.

Spatial opposite terms, such as "inner", "outer", "below", "below", "under", "above" and "over", may be used here to describe the relation between one element or feature shown in the figure and another element or feature. In addition to the orientation shown in the figure, the spatial opposite terms may be intended to cover different orientations of the device in use or operation. For example, if the device in the figure is turned over, the element which is described as "below" or "under" other elements or features will be oriented as "above" other elements or features. Therefore, the exemplary term "below" may cover both two orientations such as above and below. The device may be additionally positioned (rotated by 90 degrees or located at other orientations), and may correspondingly explain the spatial opposite descriptors used herein. In the description of the utility model, orientation or position relationships indicated by terms "longitudinal", "transverse", "upper", "lower", "front", "rear", "left", "right", "vertical", "horizontal", "top", "bottom" and the like are orientation or position relationships shown in the drawings, and these terms are merely for facilitating description of the utility model, but not for requiring that the utility model must be constructed and operated in a specific orientation, and thus, these terms cannot be understood as a limitation to the utility model. As used in the utility model, the terms "connected", "connection" and "set" should be understood in a broad sense, for example, they may be fixed connection or detachable connection, they may be direct connection or indirect connection through an intermediate part; or they may be wired connection and wireless connection, or may be connection through a wireless communication signal. For those of ordinary skill in the field, the specific meanings of the terms may be understood according to the specific conditions.

Figure 2:
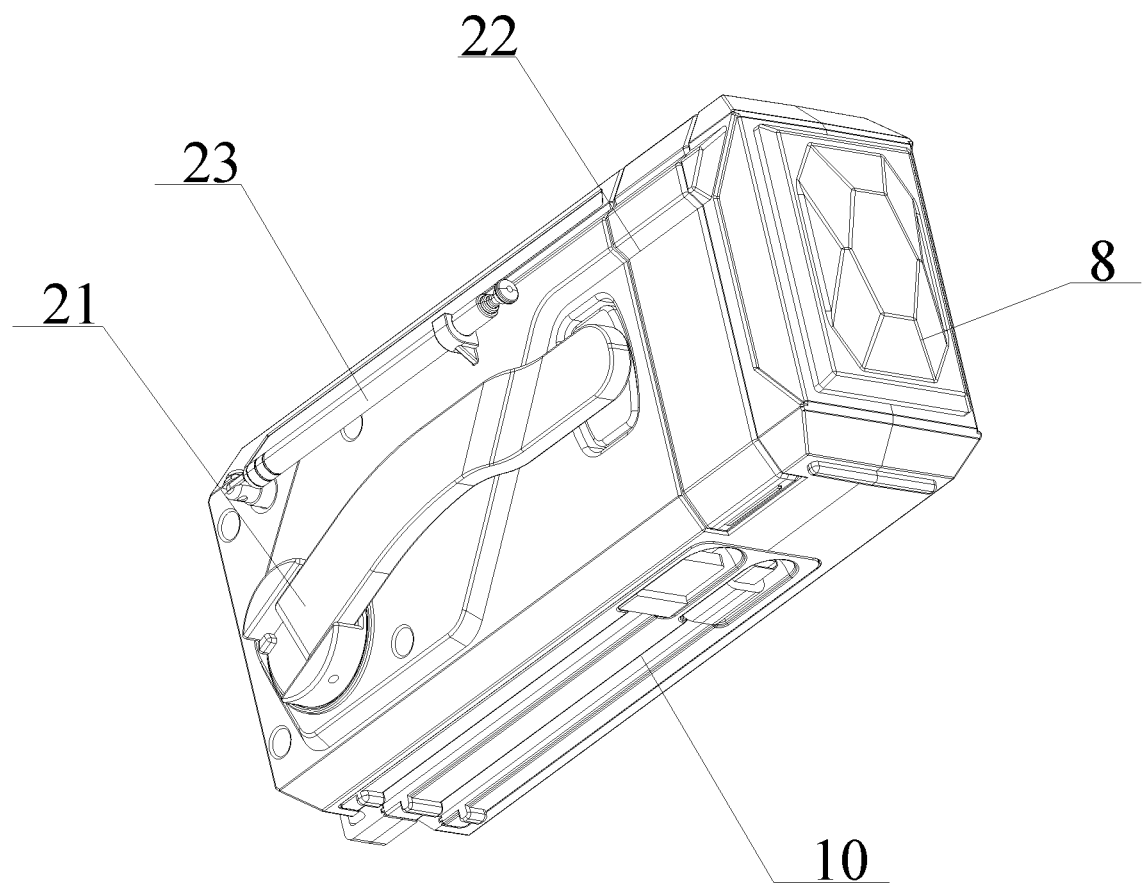
FIG. 2 is a schematic diagram of an three-dimensional structure showing rear, lower and left surfaces according to an embodiment of the utility model.
Figure 3:
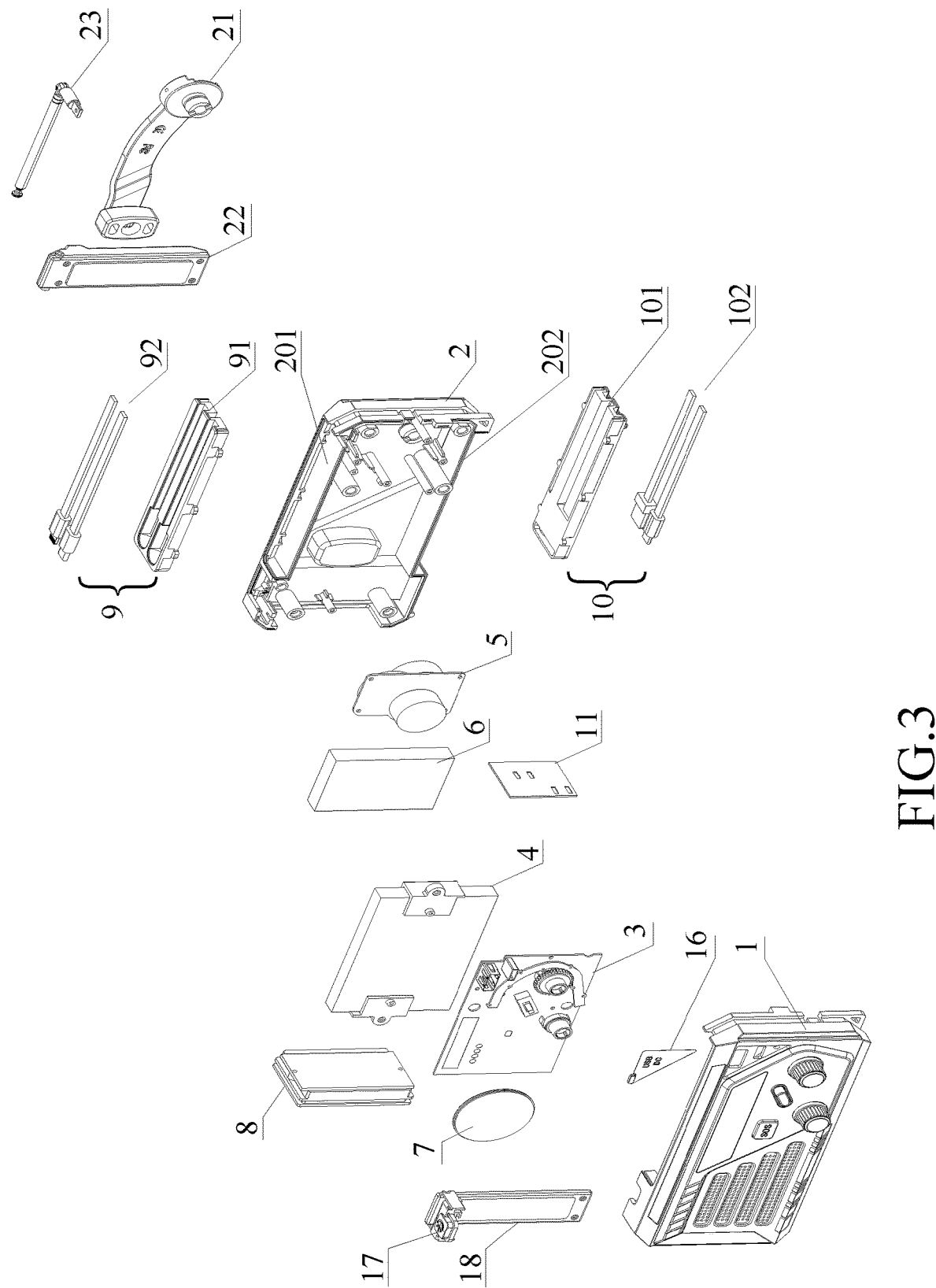
FIG. 3 is a schematic diagram of an exploded structure according to an embodiment of the present disclosure.
Figure 4:
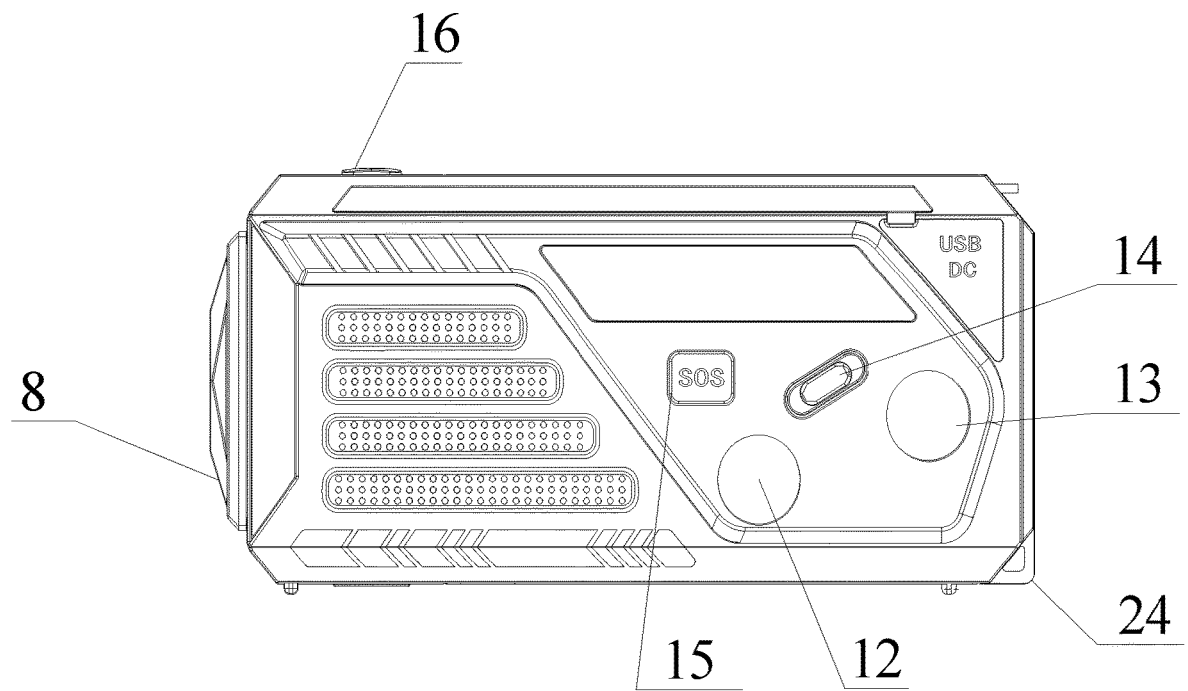
FIG. 4 is a schematic diagram of a front structure according to an embodiment of the present disclosure.
Figure 5:
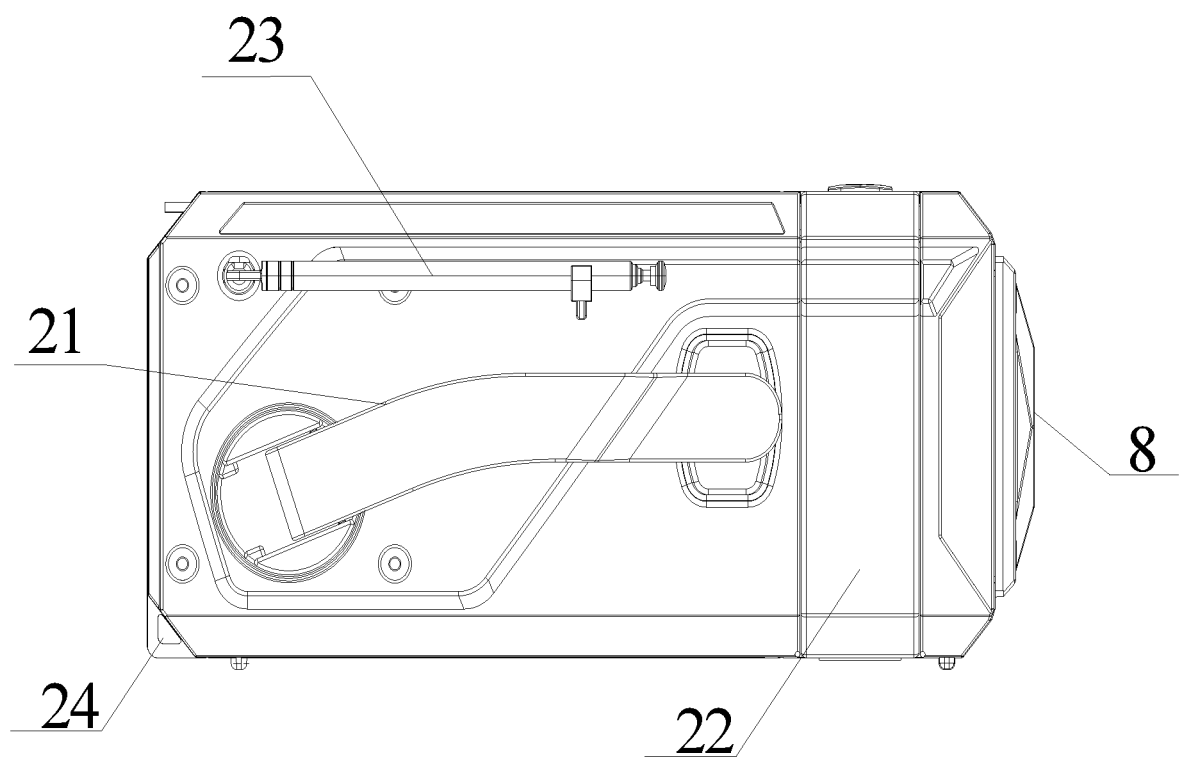
FIG. 5 is a schematic diagram of a rear structure according to an embodiment of the present disclosure.
Figure 6:
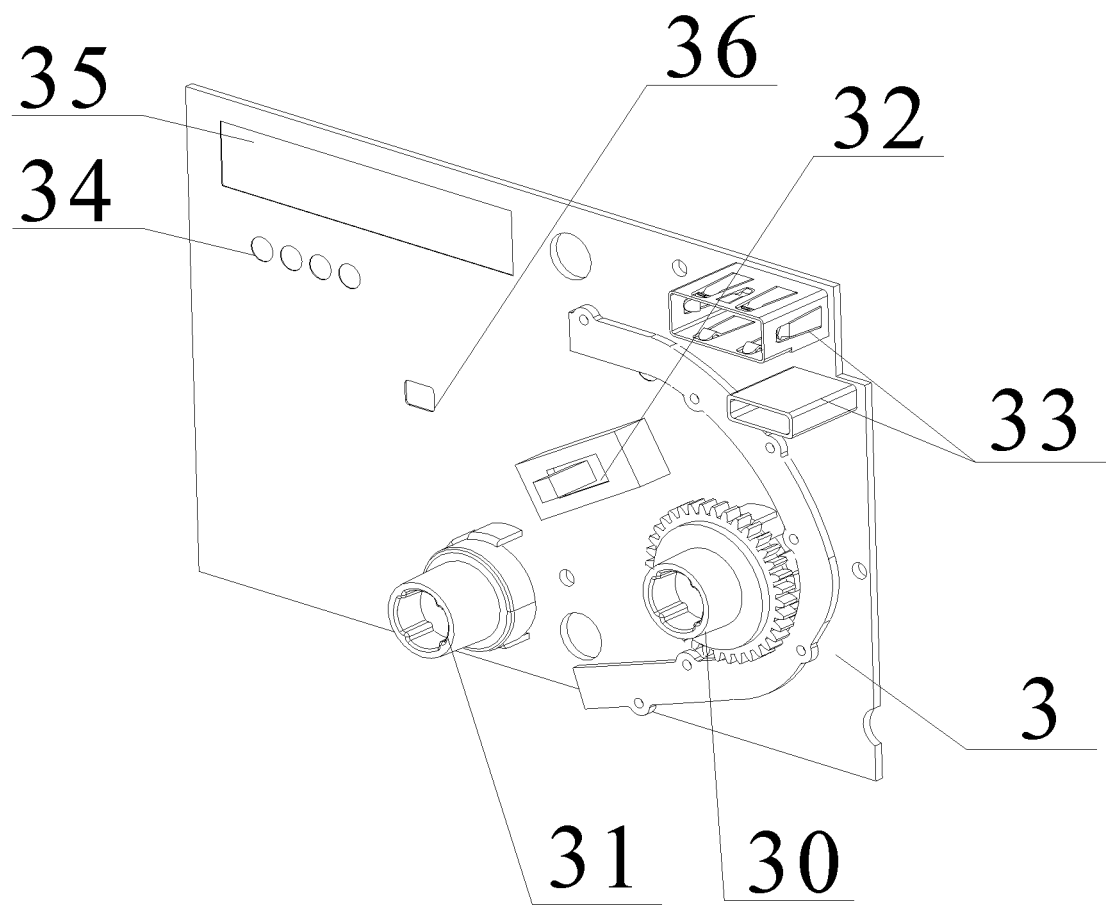
FIG. 6 is a schematic diagram of a main control panel structure according to an embodiment of the present disclosure.

As shown in FIG. 1 to FIG. 6, according to the embodiments of the utility model, a multifunctional radio is provided and includes a front shell 1 and a rear shell 2. The front shell 1 and the rear shell 2 are correspondingly connected to form a shell part of a cuboid radio. A main control panel 3 and a first battery 4 are sequentially fixedly mounted in the front shell 1; the main control panel 3 is electrically connected to the first battery 4; a loudspeaker 7 is mounted on the main control panel 3; a radio module is arranged on the main control panel 3 and includes a volume adjusting module 30 for adjusting volume and a frequency channel adjusting module 31 for adjusting frequency; a frequency modulation toggling block 32 is configured to listen to FM, AM and NOAA broadcasts; after an SOS alarm module 36 is pressed for 3 seconds, SOS alarm will sound; a USB charging interface 33 is configured to charge the first battery 4; an electric quantity indicator lamp 34 is configured to display the remaining electric quantity of the first battery 4; an outer surface of a front shell 1 is provided with several sound outlet holes corresponding to the mounting position of the loudspeaker 7, and a volume knob 12 is arranged on an outer side corresponding to the volume adjusting module 30 on the main control panel 3 and is configured to control the volume and the on and off of the radio function; a frequency modulation knob 13 is arranged at a position corresponding to the frequency channel adjusting module 31 and is configured to adjust the receiving frequency; and a switching key 14 is arranged at a position corresponding to the frequency modulation toggling block 32 and is configured to switch three receiving wavebands of FM, AM and NOAA. An outer side of the front shell 1 is provided with an SOS key 15 corresponding to the SOS alarm module 36 on the main control panel 3; the outer side of the front shell 1 is provided with a through hole corresponding to the USB charging interface 33 on the main control panel 3; and an outer side of the through hole is provided with a detachable waterproof cover 16 for preventing the charging interface from getting wet with water. The outer side of the front shell 1 is provided with a waveband lens 19 corresponding to the position of a waveband lens 35 on the main control panel 3. The display content of the waveband lens 35 and the indication of the electric indicator lamp 34 may be seen through the waveband lens 19.

An electric generator 5 and a second battery 6 are fixedly mounted on the rear shell 2; the electric generator 5 and the second battery 6 are electrically connected to the main control panel 3, respectively; the second battery 6 is connected to the first battery 4 in parallel; a hand rocker 21 is hinged at an outer side of the rear shell 2 corresponding to the position of the electric generator 5; one end of the hand rocker 21 is in clamping connection with the electric generator 5; the hand rocker 21 is shaken to drive the electric generator 5 to generate electricity; and electric energy generated by the electric generator 5 will be stored in the first battery 4 and the second battery 6. The outer side of the rear shell 2 is further provided with a reading lamp module 22; one end of the reading lamp module 22 is hinged with an outer surface of the rear shell 2; and during use, a lampshade is turned up and the reading lamp module 22 is turned on. An antenna 23 is arranged on the rear shell 2; one end of the antenna 23 is hinged with the rear shell 2; and the antenna 23 is electrically connected to the main control panel 3. A first placing groove 201 is formed above the rear shell 2; a first power output module 9 is arranged in the first placing groove 201 and includes a first fixed shell 91; the first fixed shell 91 is clamped above the front shell 1 and the rear shell 2; a first data line set 92 is clamped in the first fixed shell 91 and includes two types of data lines, namely a Type-C data line and an Apple data line, which are respectively configured to charge devices such as mobile phones with two different types of interfaces. A second placing groove 202 is formed below the rear shell 2; a second power output and input module 10 is arranged in the second placing groove 202 and includes a second fixed shell 101; the second fixed shell 101 is clamped below the front shell 1 and the rear shell 2; a second data line set 102 is clamped in the second fixed shell 101 and includes two types of data lines; one is a Type-A data line for charging the first battery 4 and the second battery 6; and the other one is an Android data line for charging devices with corresponding interfaces. A power output control panel 11 is arranged on an inner side of the rear shell 2; the power output control panel 11 is electrically connected to the main control panel 3, the first power output module 9 and the second power output and input module 10, respectively; and an external device is charged through the control of the main control panel 3 and the power output control panel 11. The second data line set 102 is electrically connected to the power output control panel 11 and configured to charge devices such as mobile phones with two different types of interfaces.

The multifunctional radio provided by the utility model further includes a lighting lamp module 8 that is fixedly mounted on a left side of the radio shell; a lighting control panel 18 is fixedly mounted on an inner side of the rear shell 2; the lighting lamp module 8 is electrically connected to the lighting control panel 18; a lighting switch key 17 is arranged on an upper surface of the rear shell 2; and the lighting switch key 17 is electrically connected to the lighting control panel 18 and configured to control the lighting lamp module 8.

A lifting rope position 24 is arranged at one end of the bottom of the front shell 1, used to mount a lifting rope and convenient to carry.

From the above description, it can be seen that the above embodiments of the utility model achieve the following technical effects:

- the utility model is provided with a lighting lamp module, a radio module, a power output module, an SOS alarm module and a reading lamp module, integrates various functions and is more convenient to use;
- the power output module is provided with four interface types of data lines and convenient to adapt to numerous electronic device interfaces, and has higher applicability; and
- a hand-cranked charging module is provided and can perform hand-cranked charging outdoors and in other situations where charging cannot be performed, thereby improving the cruising ability of products.

Compared with the prior art, the utility model has more functions and higher applicability, and is convenient for application in different scenarios.

The above is merely illustrative of the preferred embodiments of the utility model and is not intended to limit the utility model, and various changes and modifications may be made by those skilled in the art. Any modifications, equivalent substitutions, improvements and the like made within the spirit and scope of the utility model should be included within the protection scope of the utility model.

The invention claimed is:

1. A multifunctional radio, comprising a radio shell, wherein the radio shell comprises a front shell and a rear shell; the front shell and the rear shell are butted to form a cuboid shell; several sound outlet hole are arranged on one side panel surface of an outer panel surface of the front shell, and a waveband lens, a volume knob, a frequency modulation knob, a switching key and an SOS key are arranged on the other side panel surface of the outer panel surface of the front shell; a hand rocker and a reading lamp antenna are arranged on an outer panel surface of the rear shell; a first placing groove is formed at the top of the rear shell, and a first power output module is arranged in the first placing groove; a second placing groove is formed at the bottom of the rear shell, and a second power output and input module is arranged in the second placing groove; a lighting lamp module is arranged on a side panel surface of one side of the radio shell, and a lighting switch key is arranged at the top of the radio shell; and a reading lamp module is arranged on one side panel surface of the radio shell.

2. The multifunctional radio according to claim 1, wherein the radio shell is further internally provided with:
   a main control panel, fixedly mounted on an insulated isolation column of the rear shell;
   a loudspeaker, arranged at the position of the sound outlet hole on an inner panel surface of the front shell and fixedly connected to the inner panel surface of the front shell, the loudspeaker being electrically connected to the main control panel;
   a first battery, the first battery being fixedly connected to an inner side panel surface of the rear shell, and the first battery being electrically connected to the main control panel;
   a second battery, fixedly connected to the inner side panel surface of the rear shell, the second battery being electrically connected to the main control panel; and
   a power output control panel, fixedly connected to an inner surface of a side of the rear shell, the power output control panel being electrically connected to the main control panel, and the power output control panel being electrically connected to the first power output module and the second power output and input module, respectively.

3. The multifunctional radio according to claim 2, wherein the main control panel is respectively provided with a waveband lens, a volume adjusting module, a frequency channel adjusting module, a frequency modulation toggling block and an SOS alarm module at the positions of corresponding to the waveband lens, the volume knob, the frequency modulation knob, the switching key and the SOS key on the outer side panel surface of the outer panel surface of the front shell; and the volume knob and the volume adjusting module are fixedly mounted, the frequency modulation knob and the frequency channel adjusting module are fixedly mounted, and the SOS key is mounted on the SOS alarm module.

4. The multifunctional radio according to claim 3, the main control panel is further provided with a USB charging interface, the outer panel surface of the front shell is provided with a through hole at the position corresponding to the USB charging interface, a detachable waterproof cover is arranged on an outer surface of the through hole, and the waterproof cover prevents the charging interface from getting wet with water.

5. The multifunctional radio according to claim 4, wherein an electric generator is fixedly mounted on the rear shell, and the electric generator is electrically connected to the main control panel.

6. The multifunctional radio according to claim 5, wherein a hand rocker is hinged at the position, corresponding to the electric generator, of the outer side of the rear shell; one end of the hand rocker is in clamping connection with the electric generator; and the hand rocker is shaken to drive the electric generator to generate electricity.

7. The multifunctional radio according to claim 2, wherein an antenna is arranged on the rear shell; one end of the antenna is hinged with the rear shell; and the antenna is electrically connected to the main control panel.

8. The multifunctional radio according to claim 1, wherein the lighting lamp module is fixedly mounted on a left side of the radio shell; a lighting control panel is fixedly mounted on an inner side of the rear shell; the lighting lamp module is electrically connected to the lighting control panel; the lighting switch key is arranged on an upper surface of the rear shell; and the lighting switch key is electrically connected to the lighting control panel and configured to control the lighting lamp module.

* * * * *